(12) United States Patent
Chong et al.

(10) Patent No.: US 11,664,086 B2
(45) Date of Patent: May 30, 2023

(54) COLUMN REDUNDANCY TECHNIQUES (71) Applicant: Arm Limited, Cambridge (GB)

(72) Inventors: Yew Keong Chong, Austin, TX (US);
Andy Wangkun Chen, Austin, TX (US); Bikas Maiti, Austin, TX (US);
Vivek Nautiyal, Milpitas, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/375,887

(22) Filed: Jul. 14, 2021

(65) Prior Publication Data

US 2023/0016339 A1    Jan. 19, 2023

(51) Int. Cl.
*G11C 29/00* (2006.01)
*G11C 7/10* (2006.01)
*G11C 29/18* (2006.01)

(52) U.S. Cl.
CPC .......... *G11C 29/76* (2013.01); *G11C 7/1012* (2013.01); *G11C 29/18* (2013.01); *G11C 29/785* (2013.01); *G11C 2029/1802* (2013.01)

(58) Field of Classification Search
CPC ....... G11C 29/76; G11C 7/1012; G11C 29/18; G11C 29/785
See application file for complete search history.

(56) References Cited

U.S. PATENT DOCUMENTS

| | | | | |
|---|---|---|---|---|
| 5,414,660 | A | * 5/1995 | Sugibayashi | ........ G11C 29/808 365/63 |
| 6,678,195 | B2 | * 1/2004 | Hidaka | ................ G11C 29/808 365/230.03 |
| 2013/0117636 | A1 | * 5/2013 | Kim | ........................ G11C 29/04 714/E11.055 |
| 2013/0208548 | A1 | * 8/2013 | Hung | ................... G11C 29/808 365/189.05 |
| 2019/0156882 | A1 | * 5/2019 | Kihara | ................. G11C 29/787 |

* cited by examiner

*Primary Examiner* — Han Yang
(74) *Attorney, Agent, or Firm* — Pramudji Law Group PLLC; Ari Pramudji (57) ABSTRACT

Various implementations described herein are directed to a device having memory architecture with an array of memory cells arranged in multiple columns with redundancy including first columns of memory cells disposed in a first region along with second columns of memory cells and redundancy columns of memory cells disposed in a second region that is laterally opposite the first region. The device may have column shifting logic that is configured to receive data from the multiple columns, shift the data from the first columns in the first region to a first set of the redundancy columns in the second region, and shift data from the second columns in the second region to a second set of the redundancy columns in the second region.

20 Claims, 5 Drawing Sheets

COLUMN REDUNDANCY TECHNIQUES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, networking applications have many small memory instances at system-on-a-chip (SoC) level to achieve performance targets. Sometimes, large memory instances are divided into many small instances, and input-output (IO) redundancy is not area-efficient for small instances. Some foundries manufacture memory instances with redundancy so as to increase yield with circuit design solutions that improve area. In various conventional applications, modern IO multiplexing is less area-efficient with redundancy at transistor level, which adversely impacts memory access operations, and results in lowering yield and/or degrading power, performance and area (PPA). As such, there exists a need to reduce effects of conventional physical design inefficiencies in common memory instances by implementing SoC level area overhead with IO redundancy.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to column redundancy techniques for supporting high-density memory applications in physical circuit designs. Various memory applications related to memory architecture with redundancy may be used to improve yield and power, performance and area (PPA) in memory instances, such as e.g., single memory instances and/or multiple memory instances. Some foundries may design memory instances with redundancy so as to thereby improve yield with various physical circuit design solutions that seek to improve area. In various instances, having redundancy at transistor level, input-output (IO) multiplexing may be more area-efficient than implementing redundancy inside the memory instances. Some solutions described herein provide SOC level IO multiplexing to reduce instance level area overhead of IO redundancy. Therefore, various implementations described herein provide for high-density memory IO redundancy with SoC shift-multiplexing by implementing various column redundancy techniques for supporting high-density memory applications in physical circuit designs associated therewith.

Various implementations of providing memory architecture with redundancy will be described herein with reference to FIGS. 1-5.

Figure 1:
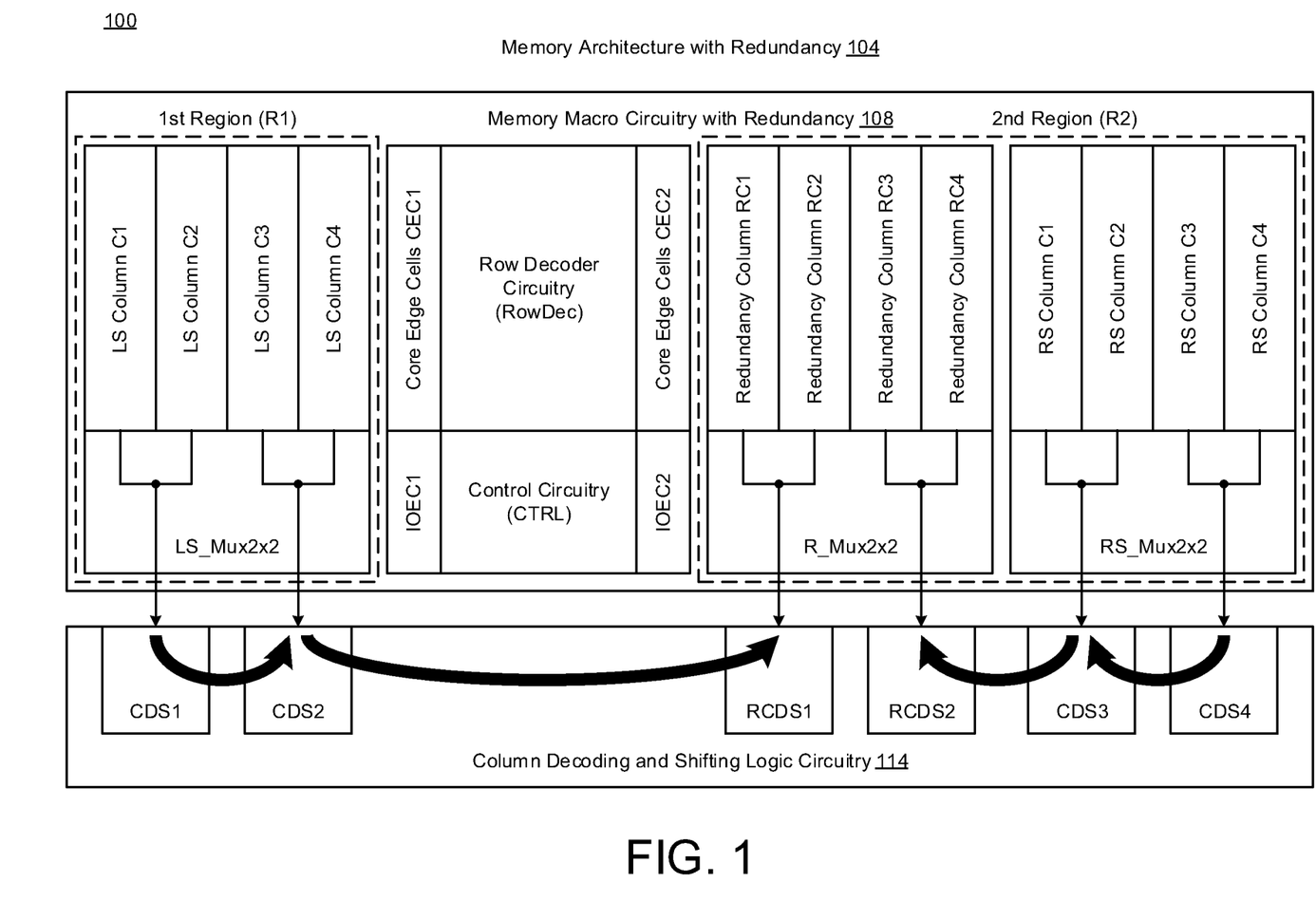
FIG. 1 illustrates a diagram of memory architecture with redundancy for a single instance in accordance with various implementations described herein.

FIG. 1 illustrates a diagram 100 of memory architecture with redundancy 104 for a single instance in accordance with various implementations described herein. The memory architecture 104 may be configured for column redundancy applications.

In various implementations, the memory architecture 104 may be implemented as a system or a device having various integrated circuit (IC) components that are arranged and coupled together as an assemblage or a combination of parts that provide for physical circuit designs and related structures. In some implementations, a method of designing, providing, fabricating and/or manufacturing the memory architecture 104 as an integrated system or device may involve use of various IC circuit components described herein so as to thereby implement various related fabrication schemes and techniques associated therewith. Also, the memory architecture 104 may be integrated with computing circuitry and components on a single chip, and the memory architecture 104 may be implemented and/or incorporated in various embedded systems for automotive, electronic, mobile, server and Internet-of-things (IoT) applications, including remote sensor nodes.

As shown in FIG. 1, memory architecture 104 may be implemented as a single memory instance having memory macro circuitry with redundancy 108. The memory macro circuitry 108 may include an array of memory cells (or bitcells) arranged in multiple columns with redundancy including first columns of memory cells (e.g., LS Columns C1-C4) disposed in a first region (R1) along with second columns of memory cells (e.g., RS Columns C1-C4) and redundancy columns of memory cells (e.g., Redundancy Columns RC1-RC4) disposed in a second region (R2) that is laterally opposite the first region (R1). The first columns may refer to left-side columns (LS Columns C1-C4), the second columns may refer to right-side columns (RS Columns C1-C4), and also, the redundancy columns may refer to redundancy columns (Redundancy Columns RC1-RC4).

The memory architecture 104 may have column shifting logic 114 that is configured to receive data from the multiple columns (LS C1-C4, RS C1-C4, RC1-RC4), shift the data from the first columns (LS C1-C4) in the first region (R1) to a first set (RC1-RC2) of the redundancy columns (RC1-RC4) in the second region (R2), and further, shift data from the second columns (RS C1-C4) in the second region (R2) to a second set (RC3-RC4) of the redundancy columns (RC1-RC4) in the second region (R2). In some instances, the column shifting logic 114 may be referred to as column decoding and shifting (CDS) logic. Also, the column shifting logic 114 may be disposed at the SoC level (i.e., system-on-a-chip level) and outside the memory instance 108. Also, at the SoC level, the column shift logic 114 may be configured to shift full IO (i.e., full input-output logic).

In some implementations, memory architecture 104 may refer to a single memory instance that is disposed in a first area of a semiconductor chip, and the column shifting logic 114 may be disposed in a second area of the semiconductor chip that is separate and distinct from the first area. Also, the first region (R1) may be positioned (or disposed) adjacent to a first side, such as, e.g., a left-side (LS) of memory architecture 104, and the second region (R2) may be positioned (or disposed) adjacent to a second side, such as, e.g., a right-side (RS) of memory architecture 104 that is laterally opposite the first side. The column shifting logic 114 may shift the data provided by the first columns (LS C1-C4) in the first side in a direction of the redundancy columns (RC1-RC4) in the second side, and also, the column shifting logic 1114 may shift data provided by the second columns (RS C1-C4) in the second side in the direction of the redundancy columns (RC1-RC4) in the second side.

In some implementations, the memory architecture 104 may include row decoder logic circuitry (RowDec) disposed between the first region (R1) and the second region (R2), wherein the first columns (LS C1-C4) in the first region (R1) may be accessible by the row decoder logic (RowDec) in a first lateral direction. The second columns (RS C1-C4) and the redundancy columns (RC1-RC4) in the second region (R2) may be accessible by the row decoder logic (RowDec) in a second lateral direction that is laterally opposite the first lateral direction. Also, the row decoder logic (RowDec) may have first core edge cells (CEC1) that interface with the first columns (LS C1-C4) in the first region (R1), and the row decoder logic (RowDec) may have second core edge cells (CEC2) that interface with the second columns (RS C1-C4) in the second region (R2). Further, the second core edge cells (CEC2) may also interface with the redundancy columns (RC1-RC4) in the second region (R2).

In some implementations, the memory architecture 104 may include data access logic circuitry having multiple multiplexers including a first multiplexer (LS_Mux2×2) disposed in the first region (R1) along with a second multiplexer (RS_Mux2×2) and also a redundancy multiplexer (R_Mux2×2) disposed in the second region (R2) that is laterally opposite the first region (R1). The first multiplexer (LS_Mux2×2) may be coupled to the first columns (LS C1-C4) in the first region (R1). The second multiplexer (RS_Mux2×2) may be coupled to the second columns (RS C1-C4) in the second region (R2), and also, the redundancy multiplexer (R_Mux2×2) may be coupled to the redundancy columns (RC1-RC2) in the second region (R2). The first multiplexer (LS_Mux2×2) couples the column shifting logic 114 to the first columns (LS C1-C4) in the first region (R1), the second multiplexer (RS C1-C4) couples the column shifting logic 114 to the second columns (RS C1-C4) in the second region (R2), and also, the redundancy multiplexer (R_Mux2×2) couples the column shifting logic 114 to the redundancy columns (RC1-RC4) in the second region (R2). In some instances, the multiple multiplexers (LS_Mux2×2, RS_Mux2×2, R_Mux2×2) may refer to 2×2 mux logic. However, in other implementations, the memory macro circuitry 108 may be scaled to any size memory, such as, e.g., 8-bit, 16-bit, 32-bit, 64-bit, etc., and thus, the multiple multiplexers may also be scaled to any size, such as, e.g., Mux4, Mux8, Mux16, etc.

In some implementations, the memory architecture 104 may include control logic circuitry (CTRL) disposed between the first region (R1) and the second region (R2), wherein the first multiplexer (LS_Mux2×2) in the first region (R1) may be accessible by the control logic (CTRL) in the first lateral direction. Also, the second multiplexer (RS_Mux2×2) and the redundancy multiplexer (R_Mux2×2) in the second region (R2) may be accessible by the control logic (CTRL) in the second lateral direction that is laterally opposite the first lateral direction. The control logic (CTRL) may have first input-output (IO) edge cells (IOEC1) that interface with the first multiplexer (LS_Mux2×2) in the first region (R1), and the control logic (CTRL) may have second IO edge cells (IOEC2) that interface with the second multiplexer (RS_Mux2×2) in the second region (R2). The second IO edge cells (IOEC2) may interface with the redundancy columns (RC1-RC4) in the second region (R2).

In some implementations, the column shifting logic 114 may have column decoding and shifting logic (CDS) coupled to the multiple multiplexers in the data access logic circuitry of the memory macro circuitry 108. For instance, a first set of left-side columns (LS C1, LS C2) may provide data to a first CDS (CDS1) by way of the first multiplexer (LS_Mux2×2), and a second set of left-side columns (LS C3, LS C4) may provide data to a second CDS (CDS2) by way of the first multiplexer (LS_Mux2×2). Also, in some instances, a first set of right-side columns (RS C1, RS C2) may provide data to a third CDS (CDS3) by way of the second multiplexer (RS_Mux2×2), and a second set of right-side columns (RS C3, RS C4) may provide data to a fourth CDS (CDS4) by way of the second multiplexer (RS_Mux2×2). Also, a first set of redundancy columns (RC1, RC2) may provide data to a first redundancy CDS (RCDS1) by way of the redundancy multiplexer (R_Mux2×2), and a second set of redundancy columns (RC3, RC4) may provide data to a second redundancy CDS (RCDS2) by way of the redundancy multiplexer (R_Mux2×2).

Figure 2:
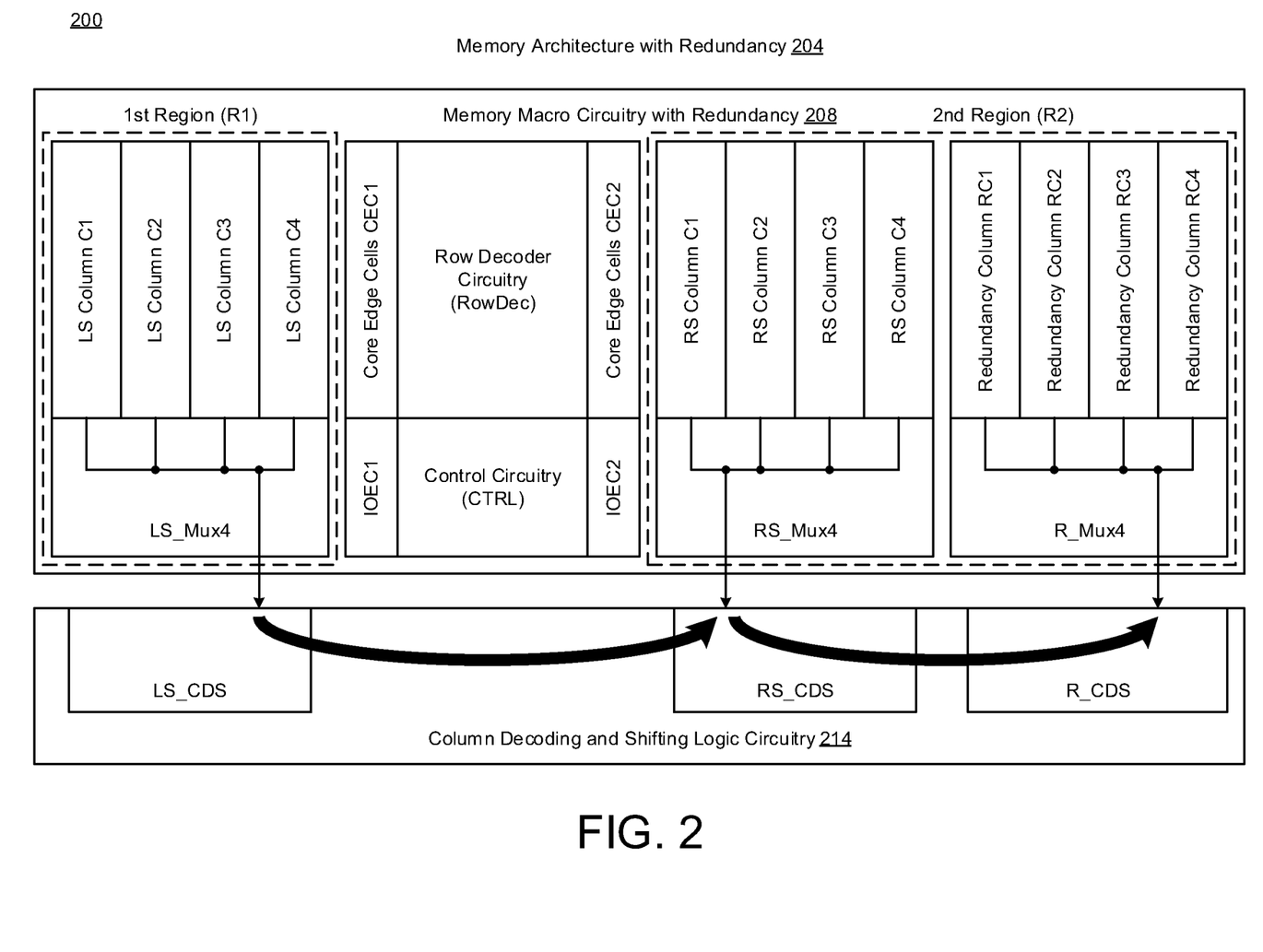
FIG. 2 illustrates a diagram of memory architecture with redundancy for a single instance in accordance with various implementations described herein.

FIG. 2 illustrates a diagram 200 of memory architecture with redundancy 204 for a single instance in accordance with various implementations described herein. The memory architecture 204 may be configured for column redundancy applications. Also, the memory architecture 204 in FIG. 2 has similar components, circuitry and logic with similar features, behaviors and characteristics as with the memory architecture 104 in FIG. 1.

In various implementations, the memory architecture 204 may be implemented as a system or a device having various integrated circuit (IC) components that are arranged and coupled together as an assemblage or a combination of parts that provide for physical circuit designs and related structures. In some implementations, a method of designing, providing, fabricating and/or manufacturing the memory architecture 204 as an integrated system or device may involve use of various IC circuit components described herein so as to thereby implement various related fabrication schemes and techniques associated therewith. Also, the memory architecture 204 may be integrated with computing circuitry and components on a single chip, and the memory architecture 204 may be implemented and/or incorporated in various embedded systems for automotive, electronic, mobile, server and Internet-of-things (IoT) applications, including remote sensor nodes.

As shown in FIG. 2, memory architecture 204 may be implemented as a single memory instance having memory macro circuitry with redundancy 208. The memory macro circuitry 208 may include an array of memory cells (or bitcells) arranged in multiple columns with redundancy including first columns of memory cells (e.g., LS Columns C1-C4) disposed in a first region (R1) along with second columns of memory cells (e.g., RS Columns C1-C4) and redundancy columns of memory cells (e.g., Redundancy Columns RC1-RC4) disposed in a second region (R2) that is laterally opposite the first region (R1). The first columns may refer to left-side columns (LS Columns C1-C4), the second columns may refer to right-side columns (RS Columns C1-C4), and also, the redundancy columns may refer to redundancy columns (Redundancy Columns RC1-RC4).

The memory architecture 204 may have column shifting logic 214 that is configured to receive data from the multiple columns (LS C1-C4, RS C1-C4, RC1-RC4), shift the data from the first columns (LS C1-C4) in the first region (R1) to the redundancy columns (RC1-RC4) in the second region (R2), and shift data from the second columns (RS C1-C4) in the second region (R2) to the redundancy columns (RC1-RC4) in the second region (R2). Also, in some instances, the column shifting logic 214 may be referred to as column decoding and shifting (CDS) logic that is capable of interfacing with Mux4 logic.

In some implementations, the memory architecture 204 may include data access logic circuitry with multiple multiplexers including a first multiplexer (LS_Mux4) disposed in first region (R1) along with a second multiplexer (RS_Mux4) and a redundancy multiplexer (R_Mux4) disposed in second region (R2) that is laterally opposite the first region (R1). The first multiplexer (LS_Mux4) may be coupled to the first columns (LS C1-C4) in the first region (R1), and the second multiplexer (RS_Mux4) may be coupled to the second columns (RS C1-C4) in the second region (R2). The redundancy multiplexer (R_Mux4) may be coupled to the redundancy columns (RC1-RC4) in the second region (R2).

The first multiplexer (LS_Mux4) couples the column shifting logic 214 to the first columns (LS C1-C4) in the first region (R1), the second multiplexer (RS C1-C4) couples the column shifting logic 214 to the second columns (RS C1-C4) in the second region (R2), and also, the redundancy multiplexer (R_Mux4) couples the column shifting logic 214 to the redundancy columns (RC1-RC4) in the second region (R2). In some instances, the multiple multiplexers (LS_Mux4, RS_Mux4, R_Mux4) may refer to mux4 logic. However, in various other implementations, the memory macro circuitry 208 may be scaled to any size memory, such as, e.g., 8-bit, 16-bit, 32-bit, 64-bit, etc., and thus, the multiple multiplexers may also be scaled to any size, such as, e.g., Mux4, Mux8, Mux16, etc.

In some implementations, the memory architecture 204 may include control logic circuitry (CTRL) disposed between the first region (R1) and the second region (R2), wherein the first multiplexer (LS_Mux4) in the first region (R1) may be accessible by the control logic (CTRL) in the first lateral direction. The second multiplexer (RS_Mux4) and the redundancy multiplexer (R_Mux4) in second region (R2) may be accessible by the control logic (CTRL) in the second lateral direction that is laterally opposite the first lateral direction. The control logic (CTRL) may have the first IO edge cells (IOEC1) that interface with the first multiplexer (LS_Mux4) in the first region (R1), and the control logic (CTRL) may have second IO edge cells (IOEC2) that interface with the second multiplexer (RS_Mux4) in the second region (R2). Also, the second IO edge cells (IOEC2) may interface with the redundancy columns (RC1-RC4) in the second region (R2).

In some implementations, the column shifting logic 214 may have column decoding and shifting logic (CDS) coupled to the multiple multiplexers in the data access logic circuitry of the memory macro circuitry 208. For instance, left-side columns (LS C1-C4) may provide data to a left-side CDS (LS_CDS) by way of a left-side multiplexer (LS_Mux4). Also, in some instances, right-side columns (RS C1-C4) may provide data to a right-side CDS (RS_CDS) by way of a right-side multiplexer (RS_Mux4). Also, redundancy columns (RC1-RC4) provide data to a redundancy CDS(R_CDS) by way of a redundancy multiplexer (R_Mux4). As such, as shown in FIG. 2, the left-side multiplexer (LS_Mux4) may have mux4 logic that couples the first columns (LS C1-C4) in the first region (R1) to the column shifting logic 214, the right-side multiplexer (RS_Mux4) may have mux4 logic that couples the second columns (RS C1-C4) in the second region (R2) to the column shifting logic 214, and also, the redundancy multiplexer (R_Mux4) may have mux4 logic that couples the redundancy columns (RC1-RC4) in the second region (R2) to the column shifting logic 214.

Figure 3:
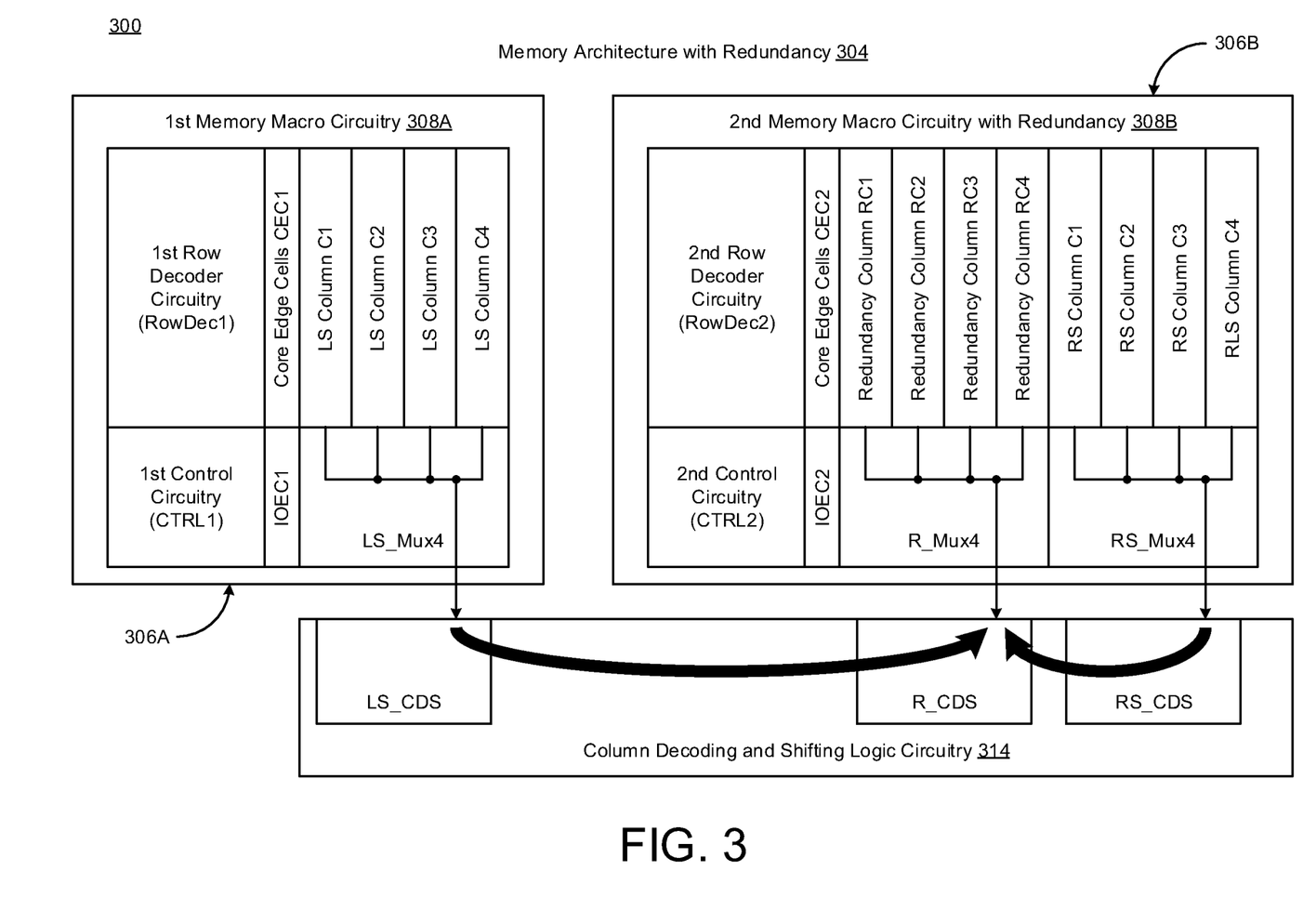
FIG. 3 illustrates a diagram of memory architecture with redundancy for multiple instances in accordance with various implementations described herein.

FIG. 3 illustrates a diagram 300 of memory architecture with redundancy 304 for multiple instances in accordance with various implementations described herein, wherein the memory architecture 304 may be configured for column redundancy applications. Also, the memory architecture 304 in FIG. 3 has similar components, circuitry and logic with similar features, behaviors and characteristics as with the memory architecture 104 in FIG. 1.

In various implementations, the memory architecture 304 may be implemented as a system or a device having various integrated circuit (IC) components that are arranged and coupled together as an assemblage or a combination of parts that provide for physical circuit designs and related structures. In some implementations, a method of designing, providing, fabricating and/or manufacturing the memory architecture 304 as an integrated system or device may involve use of various IC circuit components described herein so as to thereby implement various related fabrication schemes and techniques associated therewith. Also, the memory architecture 304 may be integrated with computing circuitry and components on a single chip, and the memory architecture 304 may be implemented and/or incorporated in various embedded systems for automotive, electronic, mobile, server and Internet-of-things (IoT) applications, including remote sensor nodes.

As shown in FIG. 3, memory architecture 304 may be implemented with multiple memory instances including first memory macro circuitry with redundancy 308A and second memory macro circuitry with redundancy 308B. In various implementations, each of memory macro circuitry 308A, 308B may have a memory structure having an array of memory cells (or bitcells) arranged in multiple columns with redundancy. The first memory macro circuitry 308A may refer to a first memory structure having the first columns of memory cells (e.g., LS Columns C1-C4) disposed in a first area 306A of a semiconductor chip. The second memory macro circuitry 308B may refer to a second memory structure having the second columns of memory cells (e.g., RS Columns C1-C4) and the redundancy columns of memory cells (e.g., Redundancy Columns RC1-RC4) disposed in a second area 306B of the semiconductor chip that is separate and distinct from the first area 306A. The first columns may refer to left-side columns (LS Columns C1-C4), the second columns may refer to right-side columns (RS Columns C1-C4), and also, the redundancy columns may refer to the redundancy columns (Redundancy Columns RC1-RC4).

The memory architecture 304 may have column shifting logic 314 that is configured to receive data from the multiple columns (LS C1-C4, RS C1-C4, RC1-RC4) and shift data from the first columns (LS C1-C4) in the first memory structure 308A in the first area 306A to the redundancy columns (RC1-RC4) in the second memory structure 308B in the second area 306B. The column shifting logic 314 is configured to shift data from the second columns (RS C1-C4) in the second memory structure 308B in the second area 306B to the redundancy columns (RC1-RC4) in the second memory structure 308B in the second area 306B. Also, in some instances, the column shifting logic 314 may be referred to as column decoding and shifting (CDS) logic that is capable of interfacing with Mux4 logic. The first memory structure 308A in the first area 306A is separate and distinct from the second memory structure 308B in the second area 306B, and also the column shifting logic 314 is separate and distinct from the first memory structure 308A and the second memory structure 308B.

In some implementations, the column shifting logic 314 may be coupled to the first memory structure 308A so as to shift the data provided by the first columns (LS C1-C4) in the first memory structure 308A in the direction of the redundancy columns (RC!-RC4) in the second memory structure 308B. The column shifting logic 314 may be coupled to the second memory structure 308B so as to shift the data provided by the second columns (RS C1-C4) in the second memory structure 308B in the direction of the redundancy columns (RC1-RC4) in the second memory structure 308B.

In some implementations, the memory architecture 304 may have first row decoder logic circuitry (RowDec1) disposed in the first memory structure 308A, and also, the memory architecture 304 may have second row decoder logic circuitry (RowDec2) disposed in the second memory structure 308B. The first columns (LS C1-C4) disposed in the first memory structure 308A may be accessible by the first row decoder logic (RowDec1), and the second columns (RX C1-C4) along with the redundancy columns (RC1-RC4) disposed in the second memory structure 308B may be accessible by the second row decoder logic RowDec2).

In some implementations, the first row decoder logic (RowDec1) may include first core edge cells (CEC1) that interface with the first columns (LS C1-C4) in the first memory structure 308A. Also, the second row decoder logic (RowDec2) may have second core edge cells (CEC2) that interface with the second columns (RS C1-C4) along with the redundancy columns (RC1-RC4) in the second memory structure 308B.

In some implementations, the memory architecture 304 may have first data access logic circuitry with a first multiplexer (LS_Mux4) disposed in the first memory structure 308A, and the first multiplexer (LS_Mux4) may be coupled to the first columns (LS C1-C4) in first memory structure 308A. Also, the memory architecture 304 may have second data access logic circuitry with a second multiplexer (RS_Mux4) and a redundancy multiplexer (R_Mux4) disposed in second memory structure 308B, and the second multiplexer (RS_Mux4) may be coupled to the second columns (RS C1-C4) in the second memory structure 308B. Also, the redundancy multiplexer (R_Mux4) may be coupled to the redundancy columns (RC1-RC4) in the second memory structure 308B.

In some implementations, the memory architecture 304 may have first control logic circuitry (CTRL1) disposed in the first memory structure 308A, and also, the first multiplexer (LS_Mux4) in the first memory structure 308A may be accessible by the first control logic (CTRL1). In addition, the memory architecture 304 may have second control logic (CTRL2) disposed in the second memory structure 308B, and also, the second multiplexer (RS_Mux4) along with the redundancy multiplexer (R_Mux4) in the second memory structure 308B may be accessible by the second control logic (CTRL2).

In some implementations, the first control logic (CTRL1) may include first IO edge cells (IOEC1) that interface with the first multiplexer (LS_Mux4) in the first memory structure 308A. Also, the second control logic (CTRL2) may include second IO edge cells (IOEC2) that interface with the second multiplexer (RS_Mux4) in the second memory structure 308B, and the second IO edge cells (IOEC2) may also interface with the redundancy columns (RC1-RC4) in the second memory structure 308B.

The first multiplexer (LS_Mux4) couples the column shifting logic 314 to the first columns (LS C1-C4) in the first memory structure 308A, the second multiplexer (RS C1-C4) couples the column shifting logic 314 to the second columns (RS C1-C4) in the memory structure 308B, and also, the redundancy multiplexer (R_Mux4) couples the column shifting logic 314 to the redundancy columns (RC1-RC4) in the second memory structure 308B. The multiple multiplexers (LS_Mux4, RS_Mux4, R_Mux4) may refer to mux4 logic. However, in various implementations, the memory macro circuitry 308A, 308B may be scaled to any size memory, such as, e.g., 8-bit, 16-bit, 32-bit, 64-bit, etc., and thus, the multiple multiplexers may also be scaled to any size, such as, e.g., Mux4, Mux8, Mux16, etc.

Figure 4:
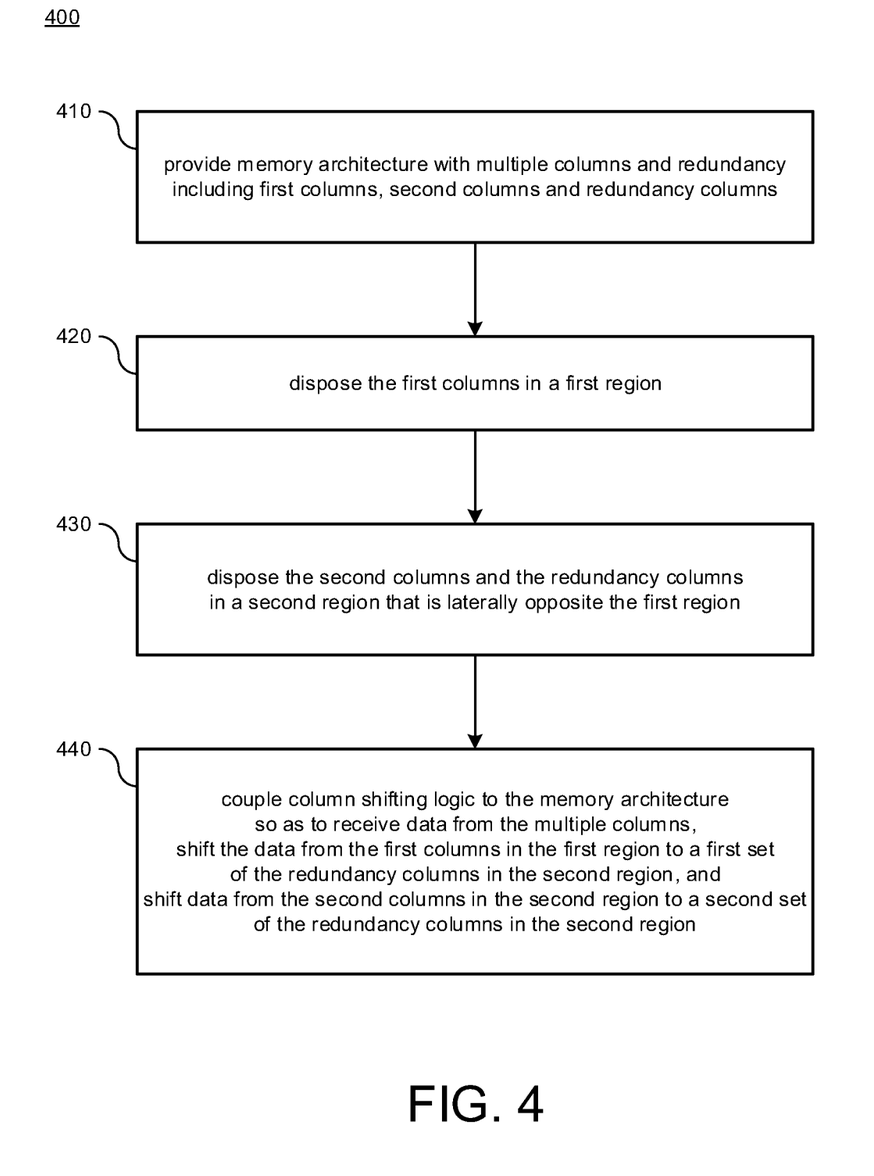
FIG. 4 illustrates a diagram of a method for using column redundancy techniques in a single instance in accordance with various implementations described herein.

FIG. 4 illustrates a diagram of a method 400 for using column redundancy in a single instance in accordance with various implementations described herein.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. For instance, if implemented in hardware, method 400 may be implemented with various components and/or circuitry, as described in FIGS. 1-3. Also, in other instances, if implemented in software, method 400 may be implemented as a program and/or software instruction process configured for providing memory architecture with column redundancy, as described herein. Also, if implemented in software, instructions related to implementing method 400 may be stored in memory and/or a database. Therefore, in various implementations, a computer or various other types of computing devices with a processor and memory may be configured to perform method 400.

As described in reference to FIG. 4, the method 400 may be used for fabricating and/or manufacturing, or causing to be fabricated and/or manufactured, an integrated circuit (IC) that implements various layout schemes and techniques in physical design as described herein so as to thereby provide memory architecture with redundancy using various related devices, components and/or circuitry as described herein.

At block 410, method 400 may provide memory architecture with multiple columns and redundancy including first columns, second columns and redundancy columns. At block 420, method 400 may dispose the first columns in a first region. At block 430, method 400 may dispose the second columns and the redundancy columns in a second region that is laterally opposite the first region. Also, at block 440, method 400 may couple column shifting logic to the memory architecture so as to receive data from the multiple columns, shift the data from the first columns in the first region to a first set of the redundancy columns in the second region, and shift data from the second columns in the second region to a second set of the redundancy columns in the second region.

In some implementations, the first region may be positioned adjacent to a first side of the memory architecture, and the second region may be positioned adjacent to a second side of the memory architecture that is laterally opposite to the first side. The column shifting logic may be configured to shift the data provided by the first columns in the first side in the direction of the redundancy columns in the second side. Also, the column shifting logic may be configured to shift the data provided by the second columns in the second side in the direction of the redundancy columns in the second side.

In some implementations, method 400 may dispose row decoder logic between the first region and the second region. The first columns in the first region may be accessible by the row decoder logic in a first lateral direction. The second columns and the redundancy columns in the second region may be accessible by the row decoder logic in a second lateral direction that is laterally opposite the first lateral direction.

In some implementations, method 400 may provide data access logic with multiple multiplexers including a first multiplexer in the first region, a second multiplexer in the second region, and a redundancy multiplexer in the second region, wherein the second region is laterally opposite to the first region. The first multiplexer may be coupled to the first columns in the first region, and the second multiplexer may be coupled to the second columns in the second region. Also, in some instances, the redundancy multiplexer may be coupled to the redundancy columns in the second region.

In some implementations, method 400 may dispose control logic between the first region and the second region. The first multiplexer in the first region may be accessible by the control logic in the first lateral direction. Also, the second multiplexer and the redundancy multiplexer in the second region may be accessible by the control logic in the second lateral direction that is laterally opposite the first lateral direction.

Figure 5:
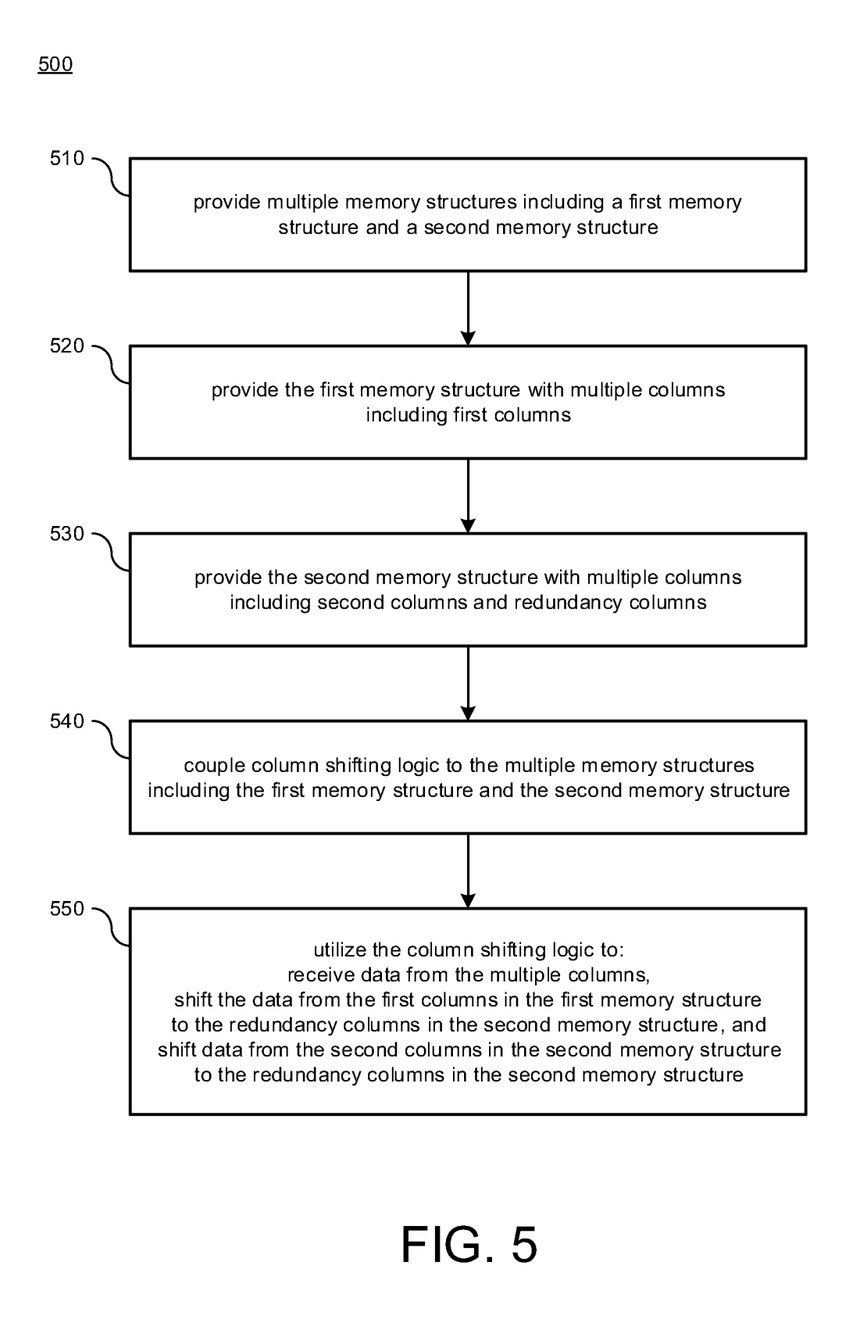
FIG. 5 illustrates a diagram of a method for using column redundancy techniques in multiple instances in accordance with various implementations described herein.

FIG. 5 illustrates a diagram of a method 500 for using column redundancy in multiple instances in accordance with various implementations described herein.

It should be understood that even though method 500 indicates a particular order of operation execution, in some cases, various portions of operations may be executed in a different order, and on different systems. In other cases, additional operations and/or steps may be added to and/or omitted from method 500. Also, method 500 may be implemented in hardware and/or software. For instance, if implemented in hardware, method 500 may be implemented with various components and/or circuitry, as described in FIGS. 1-4. Also, in other instances, if implemented in software, method 500 may be implemented as a program and/or software instruction process configured for providing memory architecture with column redundancy, as described herein. Also, if implemented in software, instructions related to implementing method 500 may be stored in memory and/or a database. Therefore, in various implementations, a computer or various other types of computing devices with a processor and memory may be configured to perform method 500.

As described in reference to FIG. 5, the method 500 may be used for fabricating and/or manufacturing, or causing to be fabricated and/or manufactured, an integrated circuit (IC) that implements various layout schemes and techniques in physical design as described herein so as to thereby provide memory architecture with redundancy using various related devices, components and/or circuitry as described herein.

At block 510, method 500 may provide multiple memory structures including a first memory structure and a second memory structure. At block 520, method 500 may provide the first memory structure with multiple columns including first columns. At block 530, method 500 may provide the second memory structure with multiple columns along including second columns and redundancy columns. At block 540, method 500 may couple column shifting logic to the multiple memory structures including the first memory structure and the second memory structure. At block 550, method 500 may utilize the column shifting logic to receive data from the multiple columns, shift the data from the first columns in the first memory structure to the redundancy columns in the second memory structure, and shift data from the second columns in the second memory structure to the redundancy columns in the second memory structure.

In some implementations, the first memory structure may be separate and distinct from the second memory structure, and the column shifting logic may be separate and distinct from the first memory structure and the second memory structure. The column shifting logic may be coupled to the first memory structure so as to shift the data provided by the first columns in the first memory structure in the direction of the redundancy columns in the second memory structure. The column shifting logic may be coupled to the second memory structure so as to shift the data provided by the second columns in the second memory structure in the direction of the redundancy columns in the second memory structure.

In some implementations, method 500 may provide first row decoder logic that is disposed in the first memory structure, and method 500 may provide second row decoder logic disposed in the second memory structure. Also, the first columns disposed in the first memory structure are accessible by the first row decoder logic, and the second columns and the redundancy columns disposed in the second memory structure are accessible by the second row decoder logic.

In some implementations, method 500 may provide first data access logic having a first multiplexer disposed in the first memory structure, and the first multiplexer is coupled to the first columns in the first memory structure. Also, method 500 may provide second data access logic with a second multiplexer and a redundancy multiplexer disposed in the second memory structure, and the second multiplexer may be coupled to the second columns in the second memory structure. Also, in some instances, the redundancy multiplexer is coupled to the redundancy columns in the second memory structure.

In some implementations, method 500 may provide first control logic disposed in the first memory structure, and the first multiplexer in the first memory structure is accessible by the first control logic. Also, method 500 may provide second control logic disposed in the second memory structure, and the second multiplexer and the redundancy multiplexer in the second memory structure are accessible by the second control logic.

In some implementations, the first multiplexer may have mux4 logic that couples the first columns in the first memory structure to the column shifting logic, and the second multiplexer may have mux4 logic that couples the second columns in the second memory structure to the column shifting logic. Also, in some instances, the redundancy multiplexer may have mux4 logic that couples the redundancy columns in the second memory structure to the column shifting logic.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having memory architecture and column shifting logic. The memory architecture may include an array of memory cells arranged in multiple columns with redundancy including first columns of memory cells disposed in a first region along with second columns of memory cells and redundancy columns of memory cells disposed in a second region that is laterally opposite the first region. The column shifting logic may be configured to receive data from the multiple columns, shift the data from the first columns in the first region to a first set of the redundancy columns in the second region, and shift data from the second columns in the second region to a second set of the redundancy columns in the second region.

Described herein are various implementations of a device having multiple memory structures and column shifting logic. The multiple memory structures may have a first memory structure and a second memory structure. The first memory structure may have multiple columns along with first columns, and the second memory structure may have multiple columns along with second columns and redundancy columns. The column shifting logic may be configured to receive data from the multiple columns, shift the data from the first columns in the first memory structure to the redundancy columns in the second memory structure, and shift data from the second columns in the second memory structure to the redundancy columns in the second memory structure.

Described herein are various implementations of a method that may provide memory architecture with multiple columns and redundancy including first columns, second columns and redundancy columns. The method may dispose the first columns in a first region, and the method may dispose the second columns and the redundancy columns in a second region that is laterally opposite the first region. The method may couple column shifting logic to the memory architecture so as to receive data from the multiple columns, shift the data from the first columns in the first region to a first set of the redundancy columns in the second region, and shift data from the second columns in the second region to a second set of the redundancy columns in the second region.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
   memory architecture having an array of memory cells arranged in multiple columns with redundancy including first columns of memory cells disposed in a first region along with second columns of memory cells and redundancy columns of memory cells disposed in a second region that is laterally opposite the first region, and wherein the redundancy columns are disposed between the first columns in the first region and the second columns in the second region;
   column shifting logic that is configured to receive data from the multiple columns, shift the data from the first columns in the first region to a first set of the redundancy columns in the second region, and shift data from the second columns in the second region to a second set of the redundancy columns in the second region; and
   row decoder logic disposed between the first region and the second region.

2. The device of claim 1, wherein:
   the memory architecture refers to a memory instance that is disposed in a first area of a semiconductor chip, and the column shifting logic is disposed in a second area of the semiconductor chip that is separate and distinct from the first area.

3. The device of claim 1, wherein:

the first region is positioned adjacent to a first side of the memory architecture such that the row decoder logic is disposed between the first columns in the first region and the redundancy columns in the second region, the second region is positioned adjacent to a second side of the memory architecture that is laterally opposite the first side such that the redundancy columns in the second region are disposed between the row decoder logic and the second columns in the second region, the column shifting logic shifts the data provided by the first columns in the first side in the direction of the redundancy columns in the second side, and the column shifting logic shifts the data provided by the second columns in the second side in the direction of the redundancy columns in the second side.

4. The device of claim 1, wherein:

the row decoder logic is disposed between the first columns in the first region and the redundancy columns in the second region, and the redundancy columns are disposed between the row decoder logic and the second columns in the second region, the first columns in the first region are accessible by the row decoder logic in a first lateral direction, and the second columns and the redundancy columns in the second region are accessible by the row decoder logic in a second lateral direction that is laterally opposite the first lateral direction.

5. The device of claim 1, further comprising:

data access logic having multiple multiplexers including a first multiplexer disposed in the first region along with a second multiplexer and a redundancy multiplexer disposed in the second region that is laterally opposite the first region, wherein the first multiplexer is coupled to the first columns in the first region, wherein the second multiplexer is coupled to the second columns in the second region, and wherein the redundancy multiplexer is coupled to the redundancy columns in the second region.

6. The device of claim 5, further comprising:

control logic disposed between the first region and the second region, wherein the first multiplexer in the first region is accessible by the control logic in the first lateral direction, and wherein the second multiplexer and the redundancy multiplexer in the second region are accessible by the control logic in the second lateral direction that is laterally opposite the first lateral direction.

7. The device of claim 5, wherein:

the first multiplexer couples the column shifting logic to the first columns in the first region, the second multiplexer couples the column shifting logic to the second columns in the second region, and the redundancy multiplexer couples the column shifting logic to the redundancy columns in the second region.

8. A device comprising:

multiple memory structures including a first memory structure and a second memory structure, wherein the first memory structure has multiple columns along with first columns, and wherein the second memory structure has multiple columns along with second columns and redundancy columns, and wherein the redundancy columns in the second memory structure are disposed between the second columns in the second memory structure and the first columns in the first memory structure;

column shifting logic that is configured to receive data from the multiple columns, shift the data from the first columns in the first memory structure to the redundancy columns in the second memory structure, and shift data from the second columns in the second memory structure to the redundancy columns in the second memory structure;

first row decoder logic disposed in the first memory structure; and second row decoder logic disposed in the second memory structure.

9. The device of claim 8, wherein the first memory structure is separate and distinct from the second memory structure, and wherein the column shifting logic is separate and distinct from the first memory structure and the second memory structure.

10. The device of claim 8, wherein:

the column shifting logic is coupled to the first memory structure so as to shift the data provided by the first columns in the first memory structure in the direction of the redundancy columns in the second memory structure, and the column shifting logic is coupled to the second memory structure so as to shift the data provided by the second columns in the second memory structure in the direction of the redundancy columns in the second memory structure.

11. The device of claim 8, wherein:

the second row decoder logic is separate and distinct from the first row decoder logic, the second row decoder logic is disposed in the second memory structure between the first columns in the first memory structure and the redundancy columns in the second memory structure, the first columns disposed in the first memory structure are accessible by the first row decoder logic, and the second columns and the redundancy columns disposed in the second memory structure are accessible by the second row decoder logic.

12. The device of claim 8, further comprising:

first data access logic having a first multiplexer disposed in the first memory structure, wherein the first multiplexer is coupled to the first columns in the first memory structure; and second data access logic having a second multiplexer and a redundancy multiplexer disposed in the second memory structure, wherein the second multiplexer is coupled to the second columns in the second memory structure, and wherein the redundancy multiplexer is coupled to the redundancy columns in the second memory structure.

13. The device of claim 12, further comprising:

first control logic disposed in the first memory structure, wherein the first multiplexer in the first memory structure is accessible by the first control logic; and second control logic disposed in the second memory structure, wherein the second multiplexer and the redundancy multiplexer in the second memory structure are accessible by the second control logic.

14. The device of claim 12, wherein:

the first multiplexer has mux4 logic that couples the first columns in the first memory structure to the column shifting logic, and the second multiplexer has mux4 logic that couples the second columns in the second memory structure to the column shifting logic, and the redundancy multiplexer has mux4 logic that couples the redundancy columns in the second memory structure to the column shifting logic.

15. A method comprising:

providing memory architecture with multiple columns and redundancy including first columns, second columns and redundancy columns;

disposing the first columns in a first region;

disposing the second columns and the redundancy columns in a second region that is laterally opposite the first region, wherein the redundancy columns in the second region are disposed between the first columns in the first region and the second columns in the second region;

coupling column shifting logic to the memory architecture so as to receive data from the multiple columns, shift the data from the first columns in the first region to a first set of the redundancy columns in the second region, and shift data from the second columns in the second region to a second set of the redundancy columns in the second region; and disposing row decoder logic between the first region and the second region.

16. The method of claim 15, wherein:

the first region is positioned adjacent to a first side of the memory architecture such that the row decoder logic is disposed between the first columns in the first region and the redundancy columns in the second region, and the second region is positioned adjacent to a second side of the memory architecture that is laterally opposite the first side such that the redundancy columns in the second region are disposed between the row decoder logic and the second columns in the second region.

17. The method of claim 16, wherein:

the column shifting logic is configured to shift the data provided by the first columns in the first side in the direction of the redundancy columns in the second side, and the column shifting logic is configured to shift the data provided by the second columns in the second side in the direction of the redundancy columns in the second side.

18. The method of claim 15, wherein:

the row decoder logic is disposed between the first columns in the first region and the redundancy columns in the second region, and the redundancy columns are disposed between the row decoder logic and the second columns in the second region, the first columns in the first region are accessible by the row decoder logic in a first lateral direction, and the second columns and the redundancy columns in the second region are accessible by the row decoder logic in a second lateral direction that is laterally opposite the first lateral direction.

19. The method of claim 15, further comprising:

providing data access logic with multiple multiplexers including a first multiplexer in the first region along with a second multiplexer and a redundancy multiplexer in the second region that is laterally opposite the first region, wherein the first multiplexer is coupled to the first columns in the first region, wherein the second multiplexer is coupled to the second columns in the second region, and wherein the redundancy multiplexer is coupled to the redundancy columns in the second region.

20. The method of claim 19, further comprising:

disposing control logic between the first region and the second region, wherein the first multiplexer in the first region is accessible by the control logic in the first lateral direction, and wherein the second multiplexer and the redundancy multiplexer in the second region are accessible by the control logic in the second lateral direction that is laterally opposite the first lateral direction.

* * * * *